United States Patent
Horwath et al.

(10) Patent No.: US 7,272,762 B2
(45) Date of Patent: Sep. 18, 2007

(54) METHOD AND APPARATUS FOR TESTING AN ULTRASOUND SYSTEM

(75) Inventors: Michael J. Horwath, Germantown, WI (US); Steven Charles Miller, Waukesha, WI (US); Michael R. Moritz, Brookfield, WI (US); Christopher Todd Ostram, Oconomowoc, WI (US)

(73) Assignee: General Electric Company, Schenectady, NY (US)

( * ) Notice: Subject to any disclaimer, the term of this patent is extended or adjusted under 35 U.S.C. 154(b) by 260 days.

(21) Appl. No.: 11/154,442

(22) Filed: Jun. 16, 2005

(65) Prior Publication Data

US 2007/0011528 A1 Jan. 11, 2007

(51) Int. Cl.
*G01R 31/28* (2006.01)

(52) U.S. Cl. ...................................... 714/727; 714/729

(58) Field of Classification Search ................ 324/763, 324/527; 714/729, 726, 727; 382/132
See application file for complete search history.

(56) References Cited

U.S. PATENT DOCUMENTS

| | | | |
|---|---|---|---|
| 5,132,635 A * | 7/1992 | Kennedy | 324/763 |
| 5,477,858 A | 12/1995 | Norris et al. | |
| 5,487,172 A | 1/1996 | Hyatt | |
| 5,592,493 A * | 1/1997 | Crouch et al. | 714/729 |
| 5,709,209 A | 1/1998 | Friemel et al. | |
| 5,736,862 A * | 4/1998 | Hamblin | 324/527 |
| 5,841,788 A * | 11/1998 | Ke | 714/726 |
| 5,862,152 A * | 1/1999 | Handly et al. | 714/727 |
| 6,286,119 B1 * | 9/2001 | Wu et al. | 714/726 |
| 6,341,172 B1 * | 1/2002 | Xu et al. | 382/132 |
| 6,822,374 B1 | 11/2004 | Smith et al. | |
| 2003/0103212 A1 | 6/2003 | Westphal et al. | |
| 2005/0105788 A1 | 5/2005 | Turek et al. | |

* cited by examiner

*Primary Examiner*—David Ton
(74) *Attorney, Agent, or Firm*—The Small Patent Law Group; Dean D. Small (57) ABSTRACT

A medical imaging system is provided that includes a plurality of circuit boards configured to be tested using boundary scan test vectors. A controller of the medical imaging system is configured to test the plurality of circuit boards. The controller is further configured to access test profiles to perform boundary scan tests on the plurality of circuit boards based on the test profiles.

20 Claims, 6 Drawing Sheets

METHOD AND APPARATUS FOR TESTING AN ULTRASOUND SYSTEM

BACKGROUND OF THE INVENTION

This invention relates generally to testing circuit boards, and more particularly, to testing systems of circuit boards.

The testing of circuit chips and circuit boards is becoming more standardized. For example, the Joint Test Action Group (JTAG) members introduced an IEEE standard 1149.1, Test Access Port and Boundary-Scan Architecture, in 1990. The JTAG standard reduces the need to design a test fixture (e.g., a bed-of-nails tester) to test circuit chip and board functionality.

The test fixture approach includes hardware to connect to the circuit board to be tested. Typically, a bed-of-nails test fixture is attached to the underside of a circuit board with contact points allowing access to test points within the circuit board, including testing of circuit board chips. Through the test fixture, opens and shorts may be produced to test the circuit board functionality. However, the designing and building of separate test fixture hardware to access and test circuit boards and circuit chips may be very expensive (e.g. $100,000 per test fixture). Further, the test fixtures are usually customized to the particular circuit board and chips to be tested, which limits the testing capabilities of the test fixture. Additionally, when modifications to the circuit board and/or chips are made, the existing test fixture may need modification, redesigning or in some cases, building a new test fixture.

The bed-of-nails approach to testing circuit boards has further disadvantages. As circuit chips become smaller, difficulty in accessing the internals of chips and circuit boards has increased. Further, smaller components has lead to the production of very complex chips that are increasingly hard to test with a bed-of-nails approach.

With the development of the JTAG IEEE 1149.1 standard (herein referred to as JTAG), a new approach has evolved. JTAG introduces a boundary-scan approach to testing. A boundary scan determines a boundary defined by, for example, a circuit board or some set of chips on a circuit board, and provides controls, such as observe/control cells that results in a bound internal net of circuitry within the boundary. The observe/control cells provide inputs to the bounded circuitry for observing the response outputs. A boundary scan (BScan) process is used to define a control and observation (e.g. a scan) of a net of circuitry (e.g. digital logic) within a boundary. Using BScan, a bed-of-nails is replaced with virtual nails or boundary scan cells. Further, board/chip manufacturers are building test points (e.g. BScan cells) into silicon chips and circuit boards. A JTAG 4/5-wire interface is often supported on the circuit board to supply a standard test access point (TAP). Essentially the hardware of a bed-of-nails test facility is replaced with software. Additionally, test access is not limited to the main I/O ports of the board, but test access is provided down to a chip I/O (pin) level through the JTAG 4/5 wire interface and the BScan cells.

Thus, the complexity of the chip is less of an issue. Boundary scan essentially partitions digital logic to facilitate control and observation of the functionality of test chip or board. For example, the BScan process partitions boards at chip I/Os for control and observation of board-level nodes. Test generation also requires less manual operation compared to previous testing methods. The BScan process provides a testing method to arbitrarily generate source test stimulus to the net structure and observe test results. The BScan testing of the net structure (e.g., a circuit board or a sub-logic of the circuit board) is independent of the integration complexity of the individual chips.

JTAG boundary scan testing has improved chip and board testing, but most of the JTAG testing is performed by manufacturers and at the chip and board level specific to those certain manufacturers. Further, JTAG testing is typically not performed to test the connectivity of a set of boards and/or a system of interconnected boards (e.g., system level testing).

Thus, JTAG testing is limited to testing of specific components within a system or board.

BRIEF DESCRIPTION OF THE INVENTION

In an exemplary embodiment, a medical imaging system is provided that includes a plurality of circuit boards configured to be tested using boundary scan test vectors. A controller of the medical imaging system is configured to test the plurality of circuit boards. The controller is further configured to access test profiles to perform boundary scan tests on the plurality of circuit boards based on the test profiles.

In another exemplary embodiment, a medical imaging system is provided that includes a plurality of interconnected components configured to be tested using boundary scan test vectors. A single test access point is configured to access the plurality of interconnected components during a test mode. A controller is configured to communicate with the plurality of interconnected components via the single test access point and to control boundary scan testing of the plurality of interconnected components during the test mode using at least one boundary scan test vector.

In yet another exemplary embodiment, a method is provided for testing a medical imaging system. The method includes communicating with a plurality of interconnected components within the medical imaging system via a single test access point. The method further includes using at least one test profile to test the plurality of interconnected components via the single test access point, with the at least one test profile used to perform at least one boundary scan test.

DETAILED DESCRIPTION OF THE INVENTION

Figure 1:
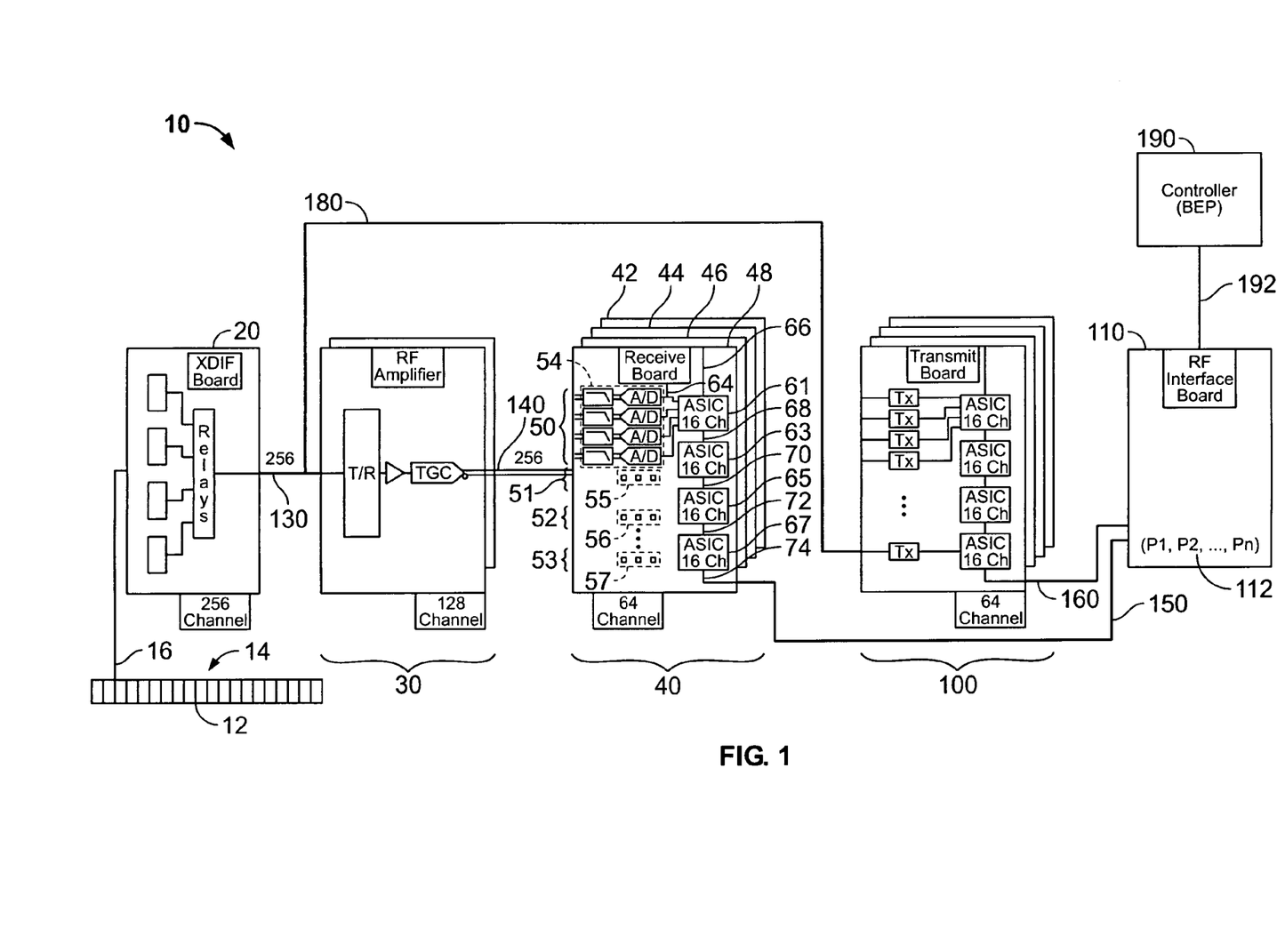
FIG. 1 is a block diagram of an exemplary ultrasound system.

FIG. 1 is a block diagram of an exemplary ultrasound system 10. The ultrasound system 10 includes a transducer array 14 having transducer elements 12, a transducer interface board 20, preamplifier boards 30, and a receive boards group 40. Each of the receive boards are identified as a receive board 42, a receive board 44, a receive board 46, and a receive board 48. The ultrasound system 10 also includes a transmit boards group 100, an interface board 110, and a backend control processor/controller (BEP) 190. It should be noted that the processor for the BScan controller may be provided by the BEP 190 and as described in more detail herein or alternatively may be, for example, an embedded processor provided on the backplane or the GFI board 110.

The receive boards group 40, the transmit boards group 100, and the interface board 110 form a beamformer (BF) portion of the ultrasound system 10. Each of the receive boards in the receive boards group 40, shown in FIG. 1 as the receive boards 42, 44, 46 and 48, has a similar architecture. Thus, only one receive board 48 is described in detail with corresponding structure present in each of the receive boards. The receive board 48 includes a plurality of Application Specific Integrated Circuit (ASIC) component groups, e.g. an ASIC group 50, an ASIC group 51, an ASIC group 52, and an ASIC group 53. Each of the ASIC component groups 50-53 has a similar architecture, and thus only one ASIC is described in detail with corresponding structure present in each of the other ASICs. The ASIC group 50 includes an A/D converter group 54 and an ASIC 61, the A/D converter group 54 provides inputs 64 to the ASIC 61.

The flow of information and processing within the ultrasound system 10 will now be described. The interface board 110 receives commands from the BEP 190 over an RFI-BEP bus 192 to control the formation of an ultrasound pulse to be emitted into a region of interest. The interface board 110 generates transmit parameters from the received commands that define a transmit beam of a certain shape and size from a certain point or points at the surface of the transducer array 14. The transmit parameters are communicated via a connection 160 (e.g., serial link) from the interface board 110 to the transmit boards group 100. The transmit boards group 100 generates transmit signals from the received transmit parameters. The transmit signals are provided at certain levels and are phased with respect to each other to steer and focus a transmit beam into one or more transmit pulses or firings.

The transmit boards group 100 communicates the transmit signals via a connection 180 through the transducer interface board 20 to drive the plurality of transducer elements 12 within the transducer array 14 as is known. The connection 180, in one embodiment, includes a plurality of individual channels or communication lines that correspond to the number of transducer elements 12. The transmit signals excite the transducer elements 12 to emit ultrasound pulses. The ultrasound pulses may be phased to form a focused beam along a desired scan line. Ultrasound echoes, which are backscattered ultrasound waves from tissue and blood samples within the scanned structure, are received at the transducer elements 12 at different times depending on the distance into the tissue from which the signals are backscattered and the angle at which the signals contact the surface of the transducer array 14. The transducer array 14 is a two-way transducer and converts the backscattered waves (ultrasound echoes) of energy into received signals.

The received signals are communicated in separate channels from the transducer array 14 via a connection 16 (e.g., communication link) to the transducer interface board 20, which communicates the received signals via a connection 130 to the preamplifier boards 30. The preamplifier boards 30 perform time gain compensation (TGC), for example, swept gain, to increase the amplitude of received signals from increasing depths in the body to compensate for the progressive attenuation of the deeper echoes. The amplified received signals from the preamplifier boards 30 are communicated via a connection 140 (e.g., communication link) to the receive boards group 40. In the illustrated example, the connections 16, 130, and 140, each include 256 channels and the channels in the connection 140 are divided into four groups of 64 channels. Each of the receive boards in the receive boards group 40, e.g., receive board 48, receives a group of 64 channels from the preamplifier boards 30.

FIG. 1 shows the four receive boards, 42, 44, 46, and 48 inter-connected such that beam data flows serially between the receive boards, for example, from the receive board 42 to the receive board 44 to the receive board 46 to the receive board 48. The receive board 48 includes ASICs 61, 63, 65, 67 connected serially and may be provided in column arrangement. Each ASIC 61, 63, 65, and 67 receives sixteen digitized receive signal inputs, e.g., the inputs 64, from four Quad channel A/D converters, for example, the A/D converter group 54. The received signals at the ASIC 61 are processed and summed and also may be summed with beam data received on a bus 66 from the previous receive board 46. The resulting beam data is provided to a bus 68. The bus 68 communicates the beam data, herein also referred to as data, to the ASIC 63. The beam data received communicated via bus 68 by the ASIC 63 may be communicated, without further processing, to a bus 70 depending upon the source of the beam data. Each of ASICs 61, 63, 65 and 67 identify incoming beam data from the bus inputs of buses 66, 68, 70 and 72, respectively, for example, beam data for beams A, B, C, and D. Depending upon the identified beam data, the beam data received on the bus 68 by the ASIC 63 will be further processed by the ASIC 63 in connection with received signals provided directly to the ASIC 63 from an A/D converter group 55. The ASIC 63 will then communicate the resulting data via the bus 70, which is then communicated to the ASIC 65. The ASIC 65 will either communicate incoming date via the bus 70 directly to the bus 72 without further processing or process the data in connection with received signals provided directly to the ASIC 65 by an A/D converter group 56. The ASIC 67 will either communicate data incoming via the bus 72 directly to a bus 74 without further processing or process the data in connection with received signals provided directly to the ASIC 67 by an A/D converter group 57. The beam data communicated via the bus 74 is then either communicated to a next receive board of the receive boards group 40 or to a data bus 150.

Processed beam data is communicated from the receive board 42 to the receive board 44, and then from the receive board 44 to the receive board 46, and finally from the receive board 46 to the receive board 48. The receive board 48 communicates the resulting fully formed beam data sets for one or more completely constructed beams to the interface board 110.

The beam data sets received via the data bus 150 are demodulated at the interface board 110 to create I/Q pairs of demodulated data values as is known. The demodulated data is further processed by the interface board 110 to provide image scan line data including, for example, echo envelope data (B-mode), Color Doppler, and Spectral Doppler and B-Flow. The image scan line data is then sean converted to convert the data from a scan sequence format to a display format as is also known. The scan converted pixel data is then provided to display component architecture (not shown in FIG. 1) to convert the digital pixel data to analog data for display on, for example, a monitor.

Figure 2:
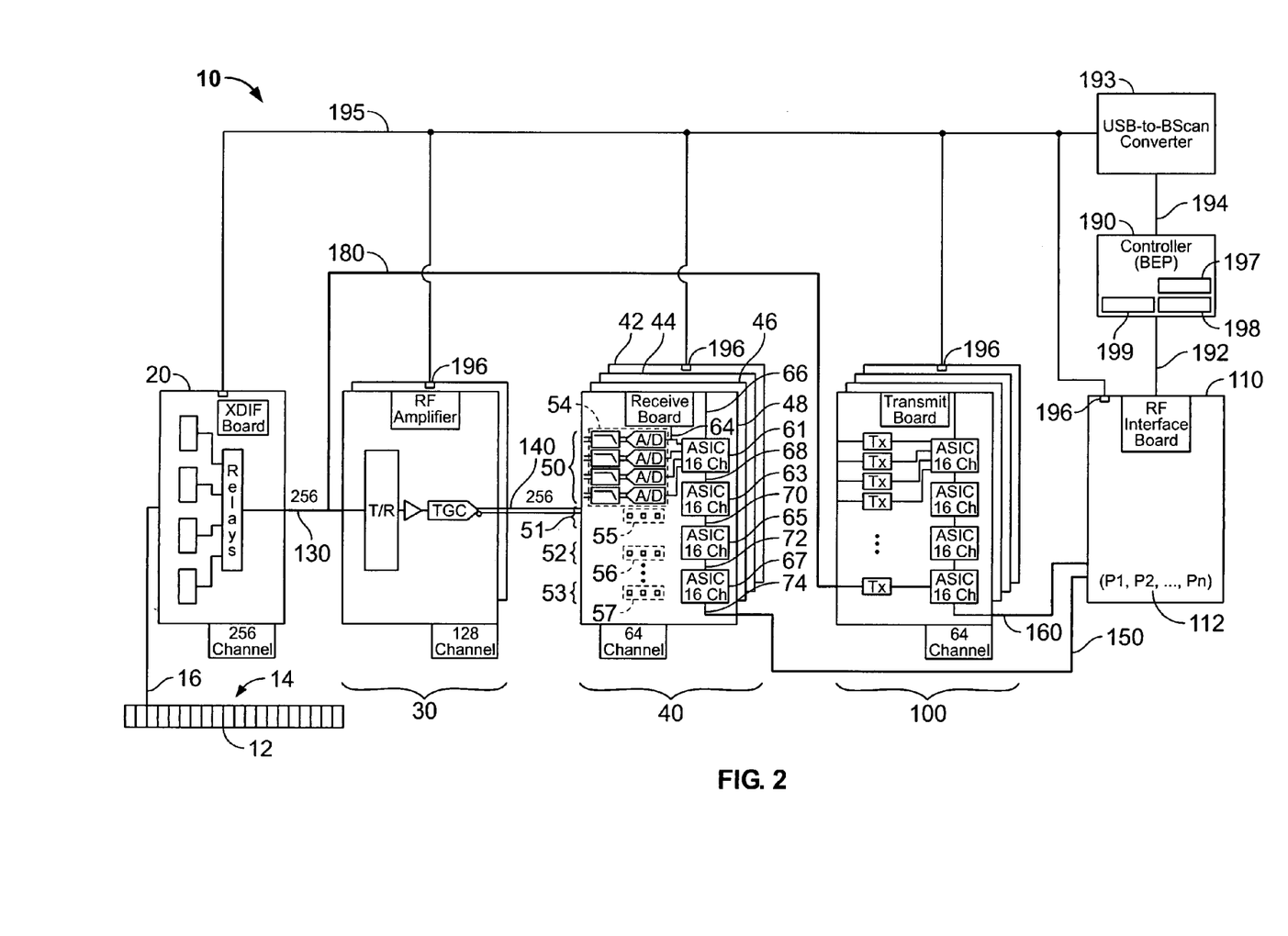
FIG. 2 is a block diagram of the ultrasound system of FIG. 1 having an exemplary test bus configuration in accordance with an embodiment of the present invention.

FIG. 2 is a block diagram of the ultrasound system 10 of FIG. 1 having an exemplary test bus configuration in accordance with an embodiment of the present invention. The BEP 190 is connected to a USB-to-BScan converter 193 via a USB link 194. The converter 193 converts from USB signaling to JTAG/BScan signaling (IEEE standard 1149.1), and from JTAG/BScan signaling to USB signaling. It should be noted that other conversions or converter may be provided, for example, for converting from PCI to BScan or from Firewire to BScan. JTAG/BScan signals are communicated via a JTAG interface bus 195 to JTAG interface controller chips 196, which may be provided on BScan testable ultrasound components, for example, ultrasound boards and/or backplanes. The BEP 190 of FIG. 2 includes storage of a memory (not shown) to store BScan test vectors 197, test profiles 198, and test results 199. The test profiles 198 generally include and define procedures that may be executed on the BEP 190 to perform various continuity and system level tests of the interconnected components of the ultrasound system 10. During execution of one of the test profiles 198, one or more of the BScan test vectors 197 may be downloaded into the ultrasound system 10 components to determine the test signal settings for inputs to the components to be tested. The observable outputs of the components testing are acquired and stored in as test results 199. It should be noted that different memory portions may be provided to store the different data (e.g., test vectors, test profiles and test results stored separately).

Figure 3:
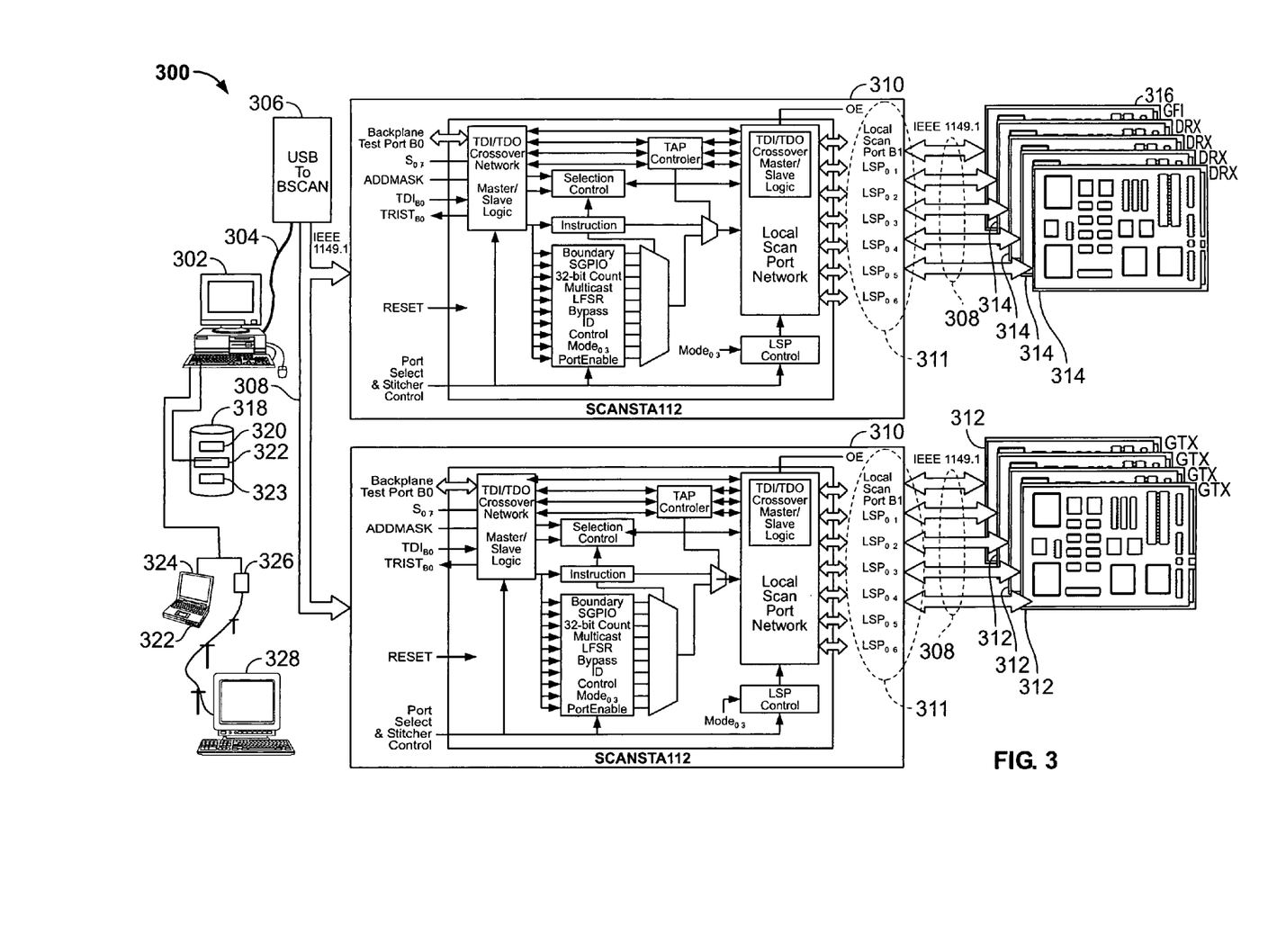
FIG. 3 is a block diagram of an exemplary medical imaging system formed in accordance with an embodiment of the present invention.

FIG. 3 is a block diagram of an exemplary BScan-testable medical imaging system 300 in accordance with an embodiment of the present invention. A plurality of transmit boards 312, receive boards 314, and a frequency interface board 316 may provide the front end or beamformer portion of an ultrasound system, for example, the ultrasound system 10 of FIG. 1. The transmit boards 312 are interconnected and provide signaling to the transducer array 14 to generate an ultrasound pulse as described above. The receive boards 314 are interconnected and provide processing to produce beam information from receive signals generated from ultrasound echoes at the transducer array 14. The individual boards, for example, the transmit board 312, the receive board 314, and the frequency interface board 316, may be individually tested, for example, at a manufacturing facility using BScan methods as described herein. Although correct functioning of a board may be verified at the manufacturing facility, correct functioning of an interconnected set of boards, for example, the plurality of receive boards 314, and/or the interconnected imaging system 300, is typically not or cannot be tested at the manufacturing facility. With a testing apparatus integrated into a medical imaging system, as illustrated in FIG. 3, BScan testing of the interconnected medical imaging system 300 may be performed after the system is deployed, for example, at a customer site. Testing of the system 300 at the customer site may be performed periodically to verify performance and modify functioning of the system 300 and subsystems of the system 300.

More particularly, the medical imaging system 300 includes testing apparatus and interfaces integrated and configured to test interconnected circuit boards, subsystems, as well as the entire integrated/interconnected medical imaging system 300. For example, in an exemplary embodiment, each of the plurality of transmit boards 312, receive boards 314, and the frequency interface board 316 is configured having a JTAG test access port (TAP) (not shown in FIG. 3) to receive a JTAG 4/5 wire interface (IEEE 1149.1) bus 308.

The TAP provides a 4/5 pin JTAG interface (IEEE 1149.1) in connection with circuit board in which the TAP is configured. The TAP may be accessed to perform BScan testing of a circuit board, for example, the board 314, and/or subsets of board components/chips. The JTAG TAP is provided as part of a board, for example, when the board is manufactured. The JTAG TAP of each board to be used for BScan testing is connected to the JTAG interface bus 308. The JTAG interface bus 308 may be connected to the USB-to-BScan converter 306 via a JTAG BScan interface controller 310. The BScan interface controller 310 provides control of the operation of a plurality of local scan ports (LSPs) 311. Each of the plurality of LSPs 311 may address a corresponding JTAG TAP, for example, the JTAG TAP of receive board 314.

The converter 306 converts between a signaling interface used by the backend processor/controller (BEP) 302 of the imaging system 300, for example, a universal serial bus (USB) interface, and the 4/5 wire JTAG (IEEE 1149.1) interface of the JTAG interface bus 308. The USB bus 304 connects the BEP 302 to the converter 306. The BEP 302 provides backend processing of image scan information to generate image information and for display by the imaging system 300. In addition, the BEP 302 may be configured to provide a single test access point for accessing and testing the interconnected components of imaging system 300. The BEP 302 may be configured to access and process BScan test profiles 322 with BScan tests performed based on the test profiles 322 described herein. The BScan test profiles 322 may contain procedures or commands for downloading to the system 300 components and interconnected components BScan test instructions and data, for example, test vectors 320. Once the information is downloaded, the test profile 322 controls BScan testing by controlling the processing of the downloaded test instructions within the interconnected components as described herein. Results from BScan testing are acquired by the test profile 322 and saved as test results 323. The test results 323 may be displayed to a user at a display, for example, a BEP 302 display device. The BScan test profiles 322, test vectors 320 and test results 323 may be stored within the BEP 302 or in an external database 318. In an alternative embodiment, the BScan test profiles 322, test vectors 320 and test results 323 are stored in a portable service unit 324, for example, a laptop computer, that may be attached to BEP 302.

In yet another alternative embodiment, the BEP 302 may be accessed from a remote computer 328. For example, a remote computer may obtain access to the BEP 302 via a modem 320. From a remote location, the imaging system 300 may be accessed and serviced via the remote computer 328. For example, maintenance personnel may periodically run BScan tests, for example, BScan test profiles 322, from the remote computer 328. The remote computer 328 may be located at a central site from which multiple imaging systems 300 may be accessed to perform BScan testing. Automatic BScan testing may also be scheduled and/or initiated, for example, diagnostics may be performed, by the BEP 302 when image system 300 components are initialized/reinitialized. BScan testing may be used to determine faults or errors at the chip and/or chip pin level. Thus, the BEP 302 may provide a single test access point for automatic testing of the interconnected components of the imaging system 300.

The test vectors 320 may be supplied, as is known, by the manufacturers of the components of the imaging system 300 and/or by third parties, for example, engineers performing enhancements to the system 300. For example, the manufacturer may provide timing and testing information for use in performing quality testing of a circuit board and circuit board components/chips. Thus, the manufacturers of the components of the imaging system 300 may provide the test vectors 320, which may be modified as desired or needed. Manufacturers typically generate and use a set of the test vectors 320 to test products, and may provide the test vectors 320 in combination with the circuit boards and components for the imaging system 300.

Figure 4:
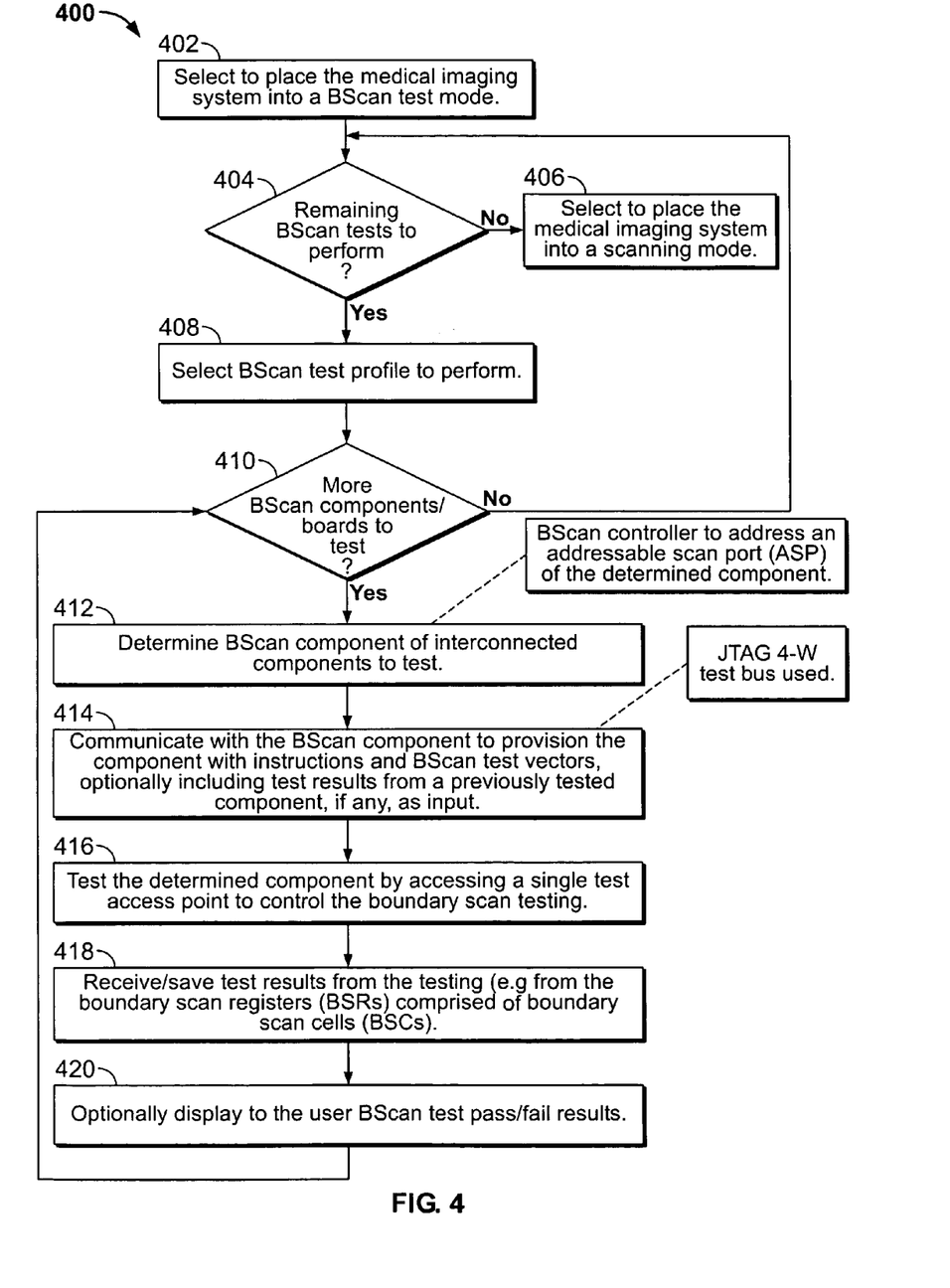
FIG. 4 is a flowchart of an exemplary process for performing BScan testing of a medical imaging system in accordance with an embodiment of the present invention.

FIG. 4 is a flowchart of an exemplary process 400 for performing BScan testing of a medical imaging system, for example, the medical imaging system 300, in accordance with an embodiment of the present invention. A system user selects at 402 BScan test mode for the medical imaging system 300. The medical imaging system 300 may normally be in a scanning mode for use in obtaining scan data and producing medical images from the scan data. To perform BScan testing on one or more interconnected components of the system 300, the user may use the BEP 302 to select at 402 the BScan test mode, which switches the operating mode from the scanning mode to a BSan test mode. At 404 determination is made as to whether BScan tests are to be performed. If there are no BScan tests remaining to be performed, the user at 406 can place the system 300 into the scanning mode for normal use, for example, by selecting a scanning mode option. If there is a remaining BScan test to be performed, one of the test profiles 322 is selected at 408. At 410 a determination is made as to whether additional components/boards are to be tested via the selected BScan test. If no more components are to be tested via the selected BScan test, processing returns to 404 to test for whether more BScan tests are to be performed.

If at 410 more components are to be tested with the selected BScan test, at 412 a determination is made based on the selected BScan test as to the BScan components to test, for example, the receive board 314 of a set of interconnected components. The BEP 302 communicates at 414 with the BScan component via the JTAG interface bus 308 to initiate the test. The BEP 302 may download test instructions and data, for example, BScan test vectors 320, based on the test profile 322, to the component to be tested. To test a group of interconnected components, for example, the group of receive boards 314 shown in FIG. 3, the test profile 322 may save the test output from a tested component as test results 323, and provide the test results 323 as an input to a next interconnected component to be tested. In an alternative embodiment, the test output from a tested component may be communicated directly as an input to a next component of the interconnected components to be tested.

At 416, the BScan component identified at 412, for example, receive board 314, is tested. At 418, the resulting output from the testing of the determined component is saved as test results 323. A boundary scan register (BSR), for example, a set of boundary scan cells (BSCs), may supply inputs to test vectors 320 and receive outputs from the testing of board nodes/chips, for example, ASICs of the component board under test. At 420, the BScan test results 323, and/or a pass or fail status for the test, may be displayed to the user. Processing returns to 410 to determine whether another BScan component of the interconnected components is to be tested.

It should be noted that the BScan testing may be performed in any known manner and executed by one or more processor of an ultrasound system.

Figure 5:
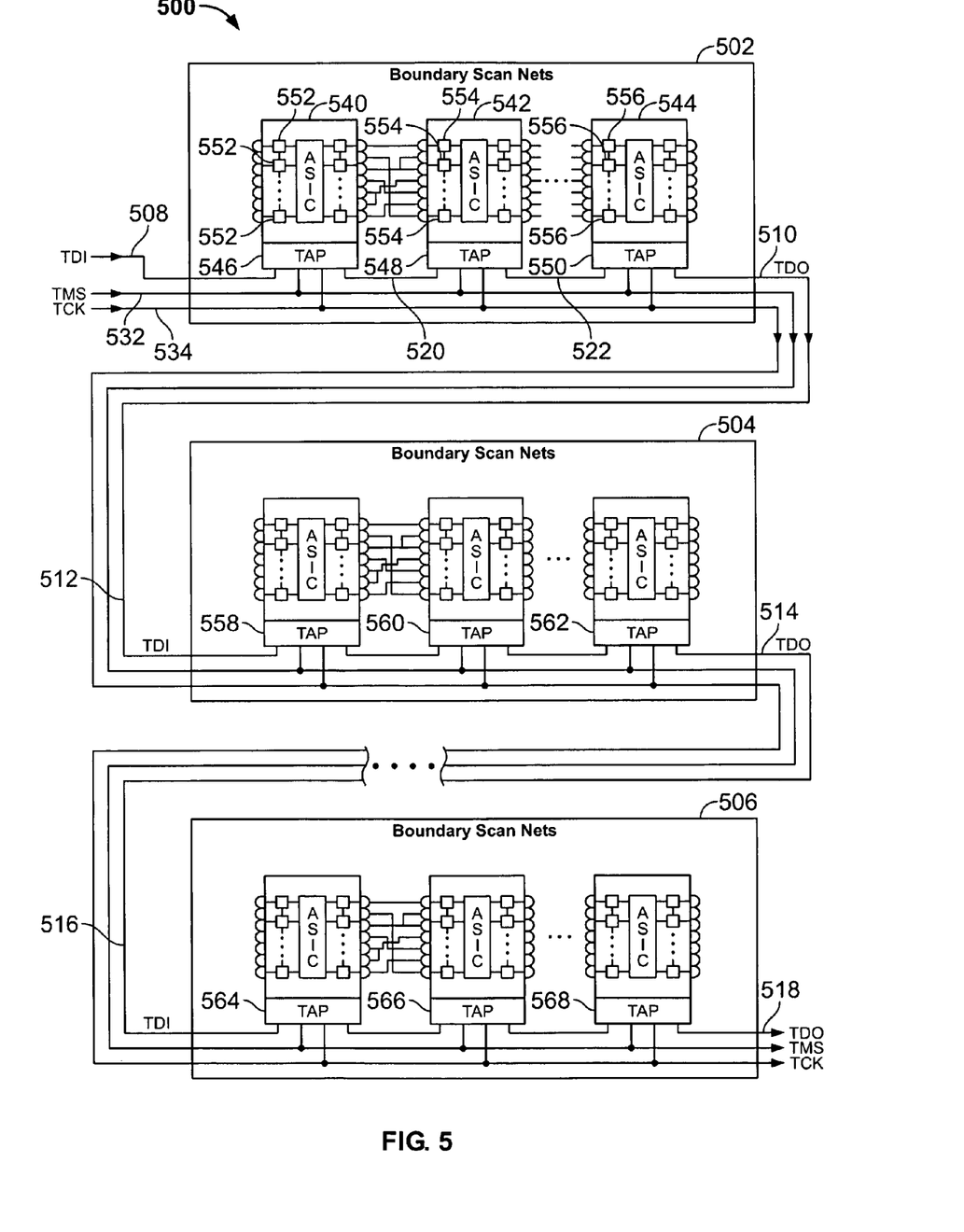
FIG. 5 is a block diagram illustrating an interconnected group of components/boards in accordance with an embodiment of the invention.

FIG. 5 is a block diagram illustrating an interconnected group 500 of components/boards 502, 504, and 506, for example, circuit boards, interconnected and configured to allow BScan testing as described herein. For example, the interconnected group 500 may include the group of receive boards 314 or the group of transmit boards 312 of FIG. 3.

The BScan interface controller 310 may be used to address/select controlled by the BEP 302, the particular component 502 from the group 500 to test. A test clock (TCK) 534 supplies clocking signals to the selected component 502 and a test mode select (TMS) 532 provides a signal for selecting a mode. Test data, for example, the test vectors 320, may be downloaded to the component 502 from the BEP 302 when the TMS 532 signals a data mode. A test data input (TDI) 508 provides a channel over which data and instructions may be downloaded to the component 502. A resulting output from the testing 416 of the component 502 may be obtained/received over a test data output (TDO) 510. The TDO 510 from the component 502 may supply an input TDI 512 for testing a subsequent interconnected board 504. The TCK 534, TMS 532, TDI 508, and TDO 510 comprise the JTAG interface bus 308. The testing apparatus and interfaces for each of the components 502, 504, and 506 may be substantially similar, and thus, the internal testing details of the components 504 and 506 are similar to those of the component 502.

The component 502 includes a plurality of nodes/chips 540, 542, and 544, each with a corresponding TAP 546, 548, and 550. The TAP 546 is serially connected via a connection 520 to the TAP 548, and the TAP 548 is serially connected via a connection 522 to the TAP 550. In this manner, the TAPs 546, 548, and 550 may be daisy-chained (or provided in a point to point arrangement) together providing a TDI type channel from the node 540 to the node 542 to the node 544. Via the TDI 508 and connections 520 and 522, test data, for example, test vectors 320, may be downloaded to the TAPs 546, 548 from the BEP 302 when the TMS 532 signals the data mode. Each of the TAPs 546, 548, and 550 provide input data received from the BEP 302 to corresponding boundary scan cells (BSCs) 552, 554, and 556. Via the TDI 508 and connections 520 and 522, test instructions or comments may be downloaded to the TAPs 546, 548, and 550 may be downloaded from the BEP 302 when the TMS 532 signals an instruction mode. The instructions then be executed in the TAPs 546, 548, and 550, for example, using an internal processor, to perform 416 a BScan test on component 502.

A test result from the testing of the component 502 may be output on the TDO 510 and serially connected to the component 504. This output then becomes the TDI 512 input to the component 504. In a manner similar to that described for the component 502, the component 504 test data and instructions or commands are communicated from the BEP 302. Once downloading of test data and/or instructions or commands is complete for the component 504, the instructions within TAPs 558, 560, and 562 of the component 504 may be executed to perform a BScan test on the component 504. Likewise, in a similar manner, a test result from the testing of the component 504 may be output on a TDO 514, and which becomes a TDI 516 input to a serially connected component 506. In a manner similar to that described for the component 502, test data and instruction or commands are communicated to the component 506 from the BEP 302. Once downloading of test data and/or instructions or commands are complete for the component 506, the instructions within TAPs 564, 566, and 568 of the component 506 may be executed to perform a BScan test on the component 506. A final test result output from the testing 416 of the interconnected components 502, 504, and 506 may be provided via a TDO 518 channel to the BEP 302 to be stored as the test results 323 for the BScan testing of the interconnected components 502, 504, and 506. Thus, and for example, the interconnectivity and proper connection (e.g., seating) of the components/boards 502, 504, and 506 with a backplane may be verified. Likewise, subsystems of components/boards, as well as the entire medical imaging system 300 may be verified for proper interconnectivity and connection of components/boards. For example, system wide testing may be performed to test the frequency interface board 316 interconnected with the group of transmit boards 312 and the group of receive boards 314 during a single test using one test profile 322. System wide testing also may verify the connectivity and performance of the overall imaging system 300.

Figure 6:
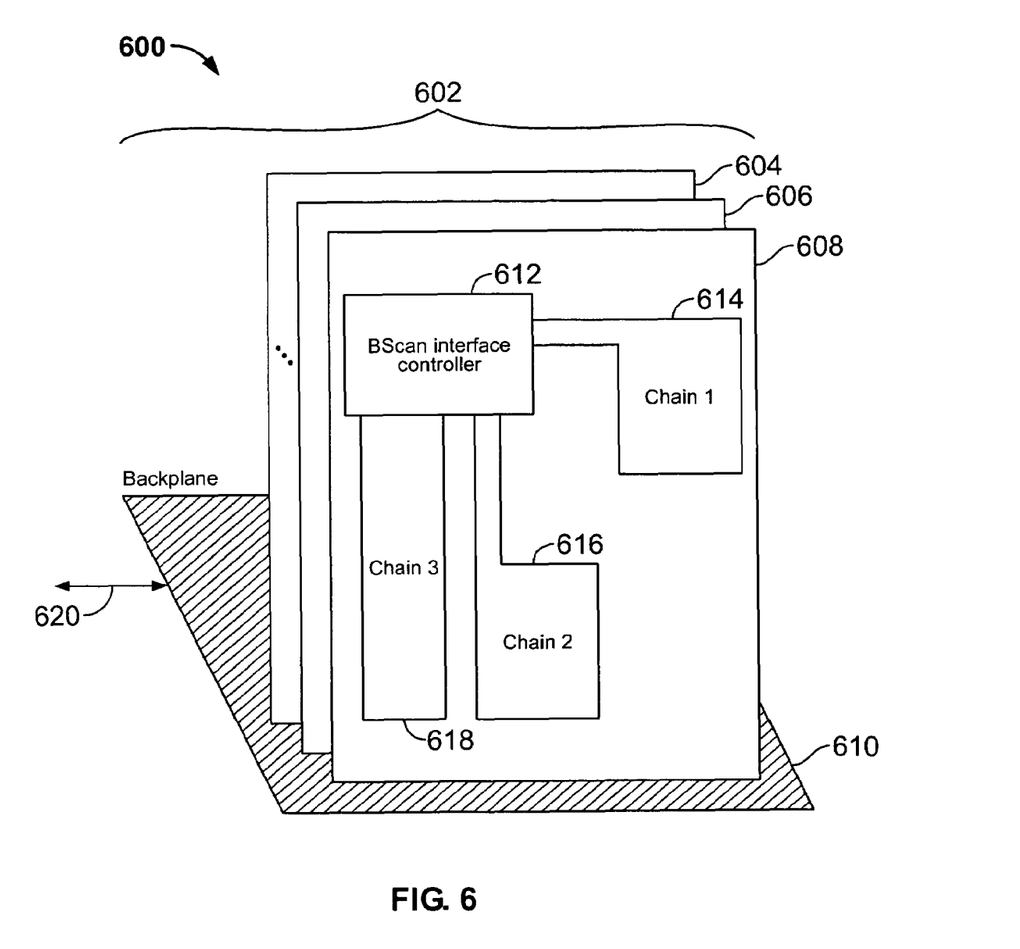
FIG. 6 is a block diagram illustrating an interconnection of a group of components in accordance with an embodiment of the invention.

FIG. 6 is a block diagram illustrating an interconnection 600 of a group 602 of components in accordance with an embodiment of the invention. The group 602 includes circuit boards 604, 606, and 608, and a backplane 610 in which the circuit boards 604-608 are connected. The backplane 610 provides the interconnections between the boards 604-608, and communicates with the BEP 302 (shown in FIG. 3) via a JTAG interface bus 620. A BScan interface controller 612 also is provided on the circuit board 608. The controller 612 controls individual scan chains, for example, chain 1, chain 2, and chain 3. Each scan chain, for example, chain 1, defines an interconnected set of board nodes, for example, the nodes 540, 542, and 544 of FIG. 5, that may be tested by a BScan test. The controller 612 may include a plurality of local scan ports (LSPs), for example, the LSPs 311 shown in FIG. 3, with each LSP being to and addressing a scan chain, for example, scan chain 1. The controller 612 controls the scan chains 1, 2, and 3 of board 608, and may control scan chains on interconnected boards, for example, boards 604 and 606.

In an alternative embodiment, one controller 612 may be provided on each the boards 604-608. In yet another alternative embodiment, the controller 612 may be provided on the backplane 610. In yet other alternative embodiments, the controller 612 may be provided on the frequency interface board 316, or on a carrier card. The controllers 612 and 310 may be provided on numerous components of the system 300 as desired or needed.

Thus, a method for BScan testing of medical imaging system components, and interconnected components and subsystems, is provided using a single access point of a medical imaging system 300, for example, the BEP 302, BScan test profiles may be scheduled and processed for execution, either locally, or from a remote location. BScan software of the system 300, for example, on the BEP 302, may coordinate the scheduling and processing of the test profiles 322. BScan testing may be used to verify interconnectivity and proper operation and performance of a medical imaging system.

While the invention has been described in terms of various specific embodiments, those skilled in the art will recognize that the invention can be practiced with modification within the spirit and scope of the claims.

What is claimed is:

1. A medical imaging system comprising:
a plurality of circuit boards configured to be tested using boundary scan test vectors; and
a controller configured to test said plurality of circuit boards, said controller further configured to access test profiles to perform boundary scan tests on said plurality of circuit boards based on the test profiles.

2. The medical imaging system of claim 1, wherein said controller is further configured to automatically access the test profiles to perform boundary scan tests.

3. The medical imaging system of claim 1, wherein said controller is configured to download the boundary scan test vectors to each of said plurality of circuit boards.

4. The medical imaging system of claim 1, wherein said controller is configured to receive results of the boundary scan tests for said plurality of circuit boards and further comprising a display to display the received results.

5. The medical imaging system of claim 1 further comprising a USB connector and a USB-to-boundary-scan converter, said USB connector connecting said controller to said USB-to-boundary-scan converter, said USB-to-boundary-scan converter connecting to said plurality of circuit boards by interfacing to a JTAG IEEE 1149.1 interface of said plurality of circuit boards.

6. The medical imaging system of claim 1, wherein the medical imaging system comprises one of an ultrasound system, an MRI system, a CT system, and a PET system.

7. The medical imaging system of claim 1, wherein the test profiles are stored within said controller.

8. The medical imaging system of claim 1, wherein the boundary scan test vectors are configured by manufacturers of said plurality of circuit boards.

9. The medical imaging system of claim 1, wherein said plurality of circuit boards are configured in one of a daisy-chained arrangement and point to point arrangement.

10. The medical imaging system of claim 1, wherein said controller is configured to be remotely accessible to test the medical imaging system.

11. The medical imaging system of claim 1, wherein said controller is configured to be accessible by a portable computer to test the medical imaging system.

12. The medical imaging system of claim 11, wherein at least one of the test profiles is stored within the portable computer.

13. A medical imaging system, comprising:
a plurality of interconnected components configured to be tested using boundary scan test vectors;
a single test access point configured to access said plurality of interconnected components during a test mode; and
a controller configured to communicate with said plurality of interconnected components via said single test access point and to control boundary scan testing of said plurality of interconnected components during the test mode using at least one boundary scan test vector.

14. The medical imaging system of claim 13, wherein the boundary scan testing comprises interconnectivity testing of said plurality of interconnected components.

15. The medical imaging system of claim 13, wherein the boundary scan testing comprise system testing of said plurality of interconnected components.

16. The medical imaging system of claim 13, wherein said controller defines said single test access point.

17. The medical imaging system of claim 13, wherein said plurality of interconnected components comprises at least one of controllers, circuit boards and backplanes.

18. The medical imaging system of claim 13, wherein said controller is further configured to select a scan mode and a test mode based on a user input.

19. A method for testing a medical imaging system, said method comprising:
communicating with a plurality of interconnected components within the medical imaging system via a single test access point; and
using at least one test profile to test the plurality of interconnected components via the single test access point, the at least one test profile used to perform at least one boundary scan test.

20. The method of claim 19, wherein said communicating comprises accessing the single test access point from one of a remote location, a portable service unit and a portable computer.

* * * * *